(12) United States Patent
Lacoste et al.

(10) Patent No.: US 7,304,435 B2
(45) Date of Patent: Dec. 4, 2007

(54) DEVICE FOR CONFINEMENT OF A PLASMA WITHIN A VOLUME

(75) Inventors: Ana Lacoste, Saint Martin le Vinoux (FR); Yves Alban-Marie Arnal, Poisat (FR); Stéphane Bechu, Bellegarde sur Valseraie (FR); Jacques Pelletier, Saint Martin d'Heres (FR)

(73) Assignee: Centre National de la Recherche Scientifique (CNRS), Paris (FR)

( * ) Notice: Subject to any disclaimer, the term of this patent is extended or adjusted under 35 U.S.C. 154(b) by 409 days.

(21) Appl. No.: 10/510,521

(22) PCT Filed: Feb. 27, 2003

(86) PCT No.: PCT/FR03/00634

§ 371 (c)(1),
(2), (4) Date: Sep. 27, 2004

(87) PCT Pub. No.: WO03/083893

PCT Pub. Date: Oct. 9, 2003

(65) Prior Publication Data

US 2005/0184670 A1    Aug. 25, 2005

(30) Foreign Application Priority Data

Mar. 28, 2002    (FR) .................................. 02 03900

(51) Int. Cl.
*H01J 7/24*    (2006.01)
(52) U.S. Cl. .............................. 315/111.71; 315/111.21
(58) Field of Classification Search ........... 315/111.21, 315/111.41, 111.71, 111.31; 118/723 MR, 118/723 MA; 204/297.02, 297.03, 297.13, 204/297.15
See application file for complete search history.

(56) References Cited

U.S. PATENT DOCUMENTS

| 4,745,337 A |   | 5/1988 | Pichot et al. |
| 6,051,151 A | * | 4/2000 | Keller et al. ................... 216/68 |
| 6,076,483 A | * | 6/2000 | Shintani et al. ...... 118/723 MA |

(Continued)

FOREIGN PATENT DOCUMENTS

JP    0300447    1/1989

(Continued)

OTHER PUBLICATIONS

"Magnetic Multipole Containment of Large Uniform Collisionless Quiescent Plasmas", R. Limpaecher, et al., 1973 American Institute of Physics, vol. 44, No. 6, Jun. 1, 1973, pp. 726-731.

*Primary Examiner*—Shih-Chao Chen
*Assistant Examiner*—Minh Dieu A
(74) *Attorney, Agent, or Firm*—Blakely, Sokoloff, Taylor & Zafman (57)    ABSTRACT

A device of a plasma (5) for confinement of a plasma within a housing (1), comprising creation means for creating a magnetic field, said means being a series of permanent magnets (3) for creation of a magnetic field presenting an alternating multi-polar magnetic structure to the plasma and the magnets (3) restrict the plasma to a large volume, the magnets begin distributed in a discontinuous around the volume end said magnets (3) arc discharge, a distance within the housing at a separation from the walls of the housing by means of support shafts (4). The changes above have been provided to improve the clarification of the claim language and claims have been amended to correct a typographical error. Since the changes are minor and are intended merely to improve the legibility of the claims, obtaining authorization from application was not viewed as necessary.

19 Claims, 6 Drawing Sheets

U.S. PATENT DOCUMENTS 6,365,010 B1 * 4/2002 Hollars .................. 204/192.12
6,436,252 B1 * 8/2002 Tzatzov et al. ........ 204/298.22
6,683,425 B1 * 1/2004 Lai ............................ 315/500

FOREIGN PATENT DOCUMENTS

WO     WO 01/73812     10/2001

* cited by examiner

DEVICE FOR CONFINEMENT OF A PLASMA WITHIN A VOLUME

GENERAL TECHNICAL DOMAIN

This invention relates to the general technical domain of plasmas, from the lowest pressures ($10^{-6}$ or less) up to pressures of the order of $10^{-2}$ torr.

More precisely, the invention relates to complete or partial confinement of plasma in a volume, and particularly confinement in large uniform plasma volumes at low and very low pressures.

The invention is advantageously used in applications for all techniques that require firstly production of dense and uniform plasma, and secondly confinement of this uniform plasma in a chamber, for example in which the application is taking place.

Remember that plasma is a conducting gaseous medium composed of electrons, ions and neutral particles, macroscopically electrically neutral. Plasma is obtained using an electric field, by ionisation of a gas by electrons accelerated in this electric field.

For some applications, it may be desirable to confine plasma in the volume of a chamber.

Plasmas may be confined in a volume using permanent magnets.

In this case, confinement is usually done by placing permanent magnets at the periphery of the confinement volume (inside or outside the chamber walls) with alternating north and south polarities facing the plasma. Therefore the periphery of the chamber is subjected to a magnetic field. This technique is called "multipole magnetic confinement".

The principle of multipole confinement of "charged species" particles forming the plasma is as follows.

The charged particles in the plasma move in the chamber between peripheral regions subjected to the magnetic field formed by the permanent magnets and central regions not subjected to the said field.

The charged particles entering the region of influence of a multipole magnetic field are subjected to three main mechanisms.

1/ Mechanism 1. Charged particles output from a region in which there is no magnetic field may be reflected on and by the magnetic field and may return into the region not subjected to the magnetic field;

2/ Mechanism 2. Charged particles output from a region in which there is no magnetic field all enter the region of the magnetic field, when their path is almost parallel to the magnetic field lines.

Charged particles subjected to mechanism 2 are lost for the plasma. These particles arrive in a region in which there is no magnetic field and move towards regions of convergence of the magnetic field lines, in other words either directly on magnetic poles of magnets (where the magnetic intensity is maximum) or between two magnets with the same polarity, where the magnetic intensity is minimum and zero. The paths of charged particles are then parallel to the magnetic field. If magnet poles are located on the walls of the chamber, the particles passing through this area will for example strike the walls of the chamber. This is the case particularly for areas located between two unit magnets with alternating polarities.

Convergence areas of magnetic field lines are called "festoons".

3/ Mechanism 3. This is a trap for charged particles in the multipole magnetic field using a collisional mechanism.

Figure 1:
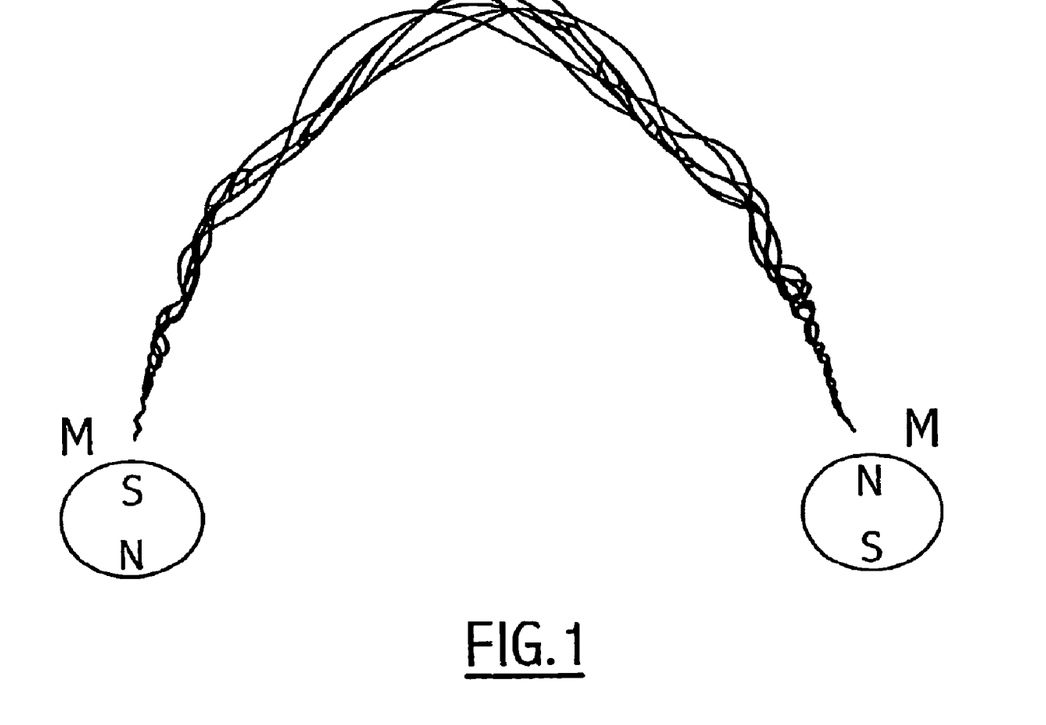
FIG. 1, already commented on, shows the path of a charged particle between two mirror points M located on the face of permanent magnets with an alternating polarity.

FIG. 1 shows that once high energy electrons are trapped in the magnetic field, and are in an interval between two elastic or inelastic collisions, they oscillate between two magnetic field lines and two mirror points M, at which the magnetic field intensity is identical. These mirror points M face two opposite magnetic poles of the same magnet or of two adjacent magnets.

High-energy electrons that produce the plasma, called fast or primary electrons are not very sensitive to the self-consistent electrical field produced by the plasma space charge.

On the contrary, the low energy ions and electrons in the plasma, also called slow or thermal electrons, also oscillate between two opposing magnetic poles, but they are also sensitive to the self-consistent electrical field produced by the plasma space charge. Consequently, they then diffuse collectively in the magnetic field under the influence of this electrical field, preferably to areas with a low or zero magnetic field.

Finally, apart from these oscillation and diffusion movements, charged particles move along or around permanent magnets, perpendicular to the plane that contains the "magnetic field" vectors generated by the magnetic structure. This is why it is preferable to close the magnetic field structures on themselves to avoid losses of charged particles at the ends of the magnetic structures. The result is then a "magnetron" type structure.

State of the Art

Several alternating polarity geometries are possible for a multipole confinement.

Figure 2:
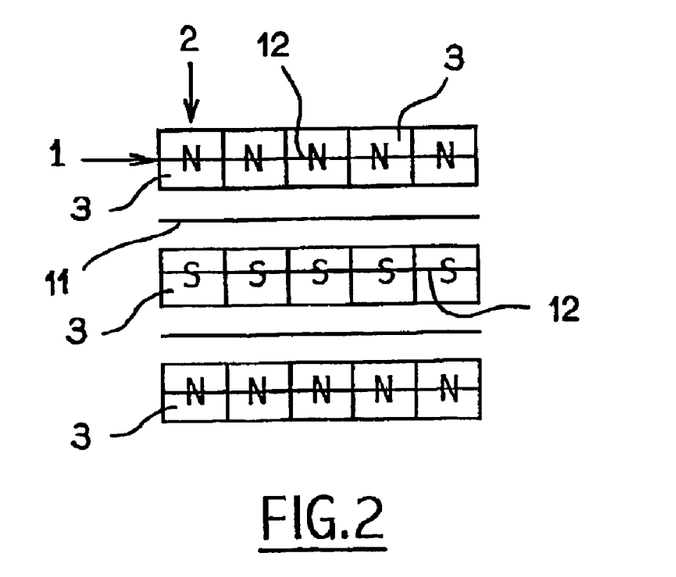
FIG. 2, already commented on, shows a geometry of a multipole structure along a continuous line.

A first conventionally used geometry is shown on FIG. 2. This type of multipole structure is called a "continuous linear structure". It presents an alternation of continuous permanent magnet lines 3 to the plasma. In FIG. 2, the polarity is alternated along a direction marked as reference 2. The continuous polarity lines extend along a direction marked as reference 1, this direction being perpendicular to the direction of alternation 2.

Figure 3:
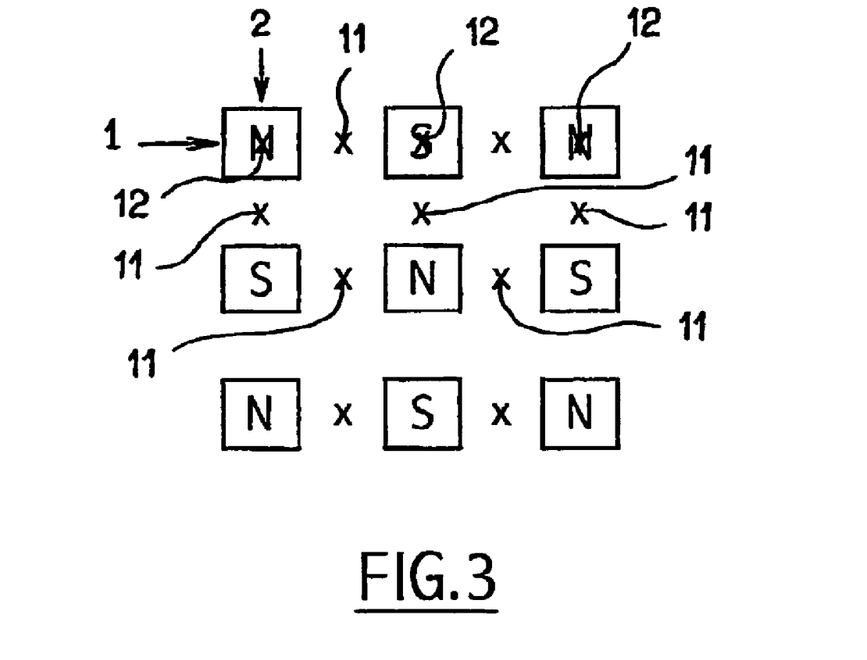
FIG. 3, already commented on, shows an alternating checkerboard multipole structure.

FIG. 3 shows another possible geometry. This is a "checkerboard" structure, which has a discontinuous alternation along two directions 1 and 2. The magnets are no longer arranged in continuous lines, each magnet has a different polarity from its neighbours along directions 1 and 2.

Figure 4:
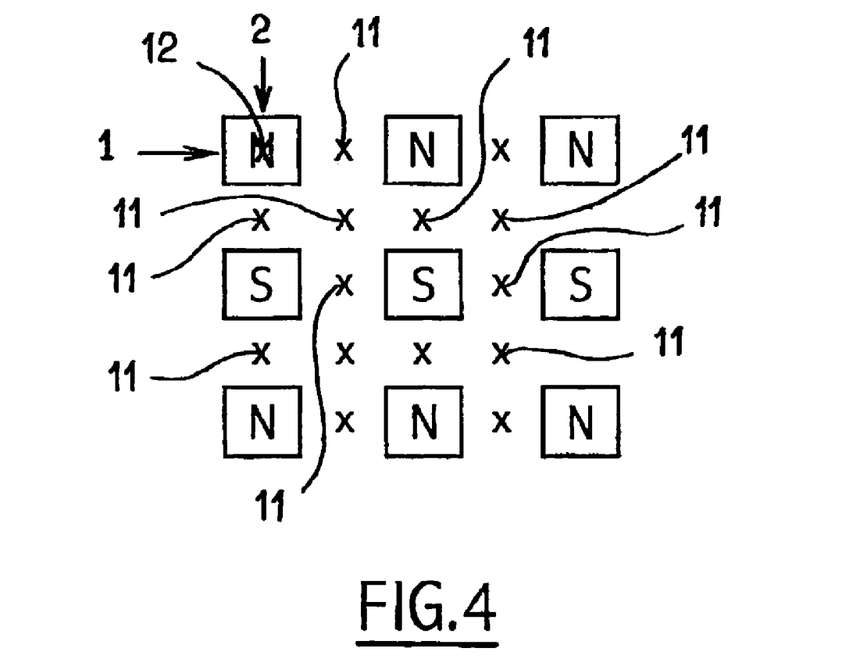
FIG. 4, already commented on, shows a multipole structure along a discontinuous or interrupted line.

A third possible geometry is shown in FIG. 4. This shows the alternation "in interrupted line". This structure uses the principle diagram of the structure in FIG. 2, but the magnets on polarity lines are at a spacing from each other.

The publications by R. Limpaecher and K. R. MacKenzie, Rev. Sci. Instrum., vol. 44, P. 726-731 (1973), and K. N. Leung, T. K. Samec, and A. Lamm, Phys. Lett., vol. 51A, p. 490-492 (1975), divulge confinement devices using the structures described in FIGS. 2 to 4.

In these devices, the permanent magnets are arranged inside and outside the confinement chamber, but the magnets still have one of the poles of each magnet located on a wall of the chamber.

Figure 5:
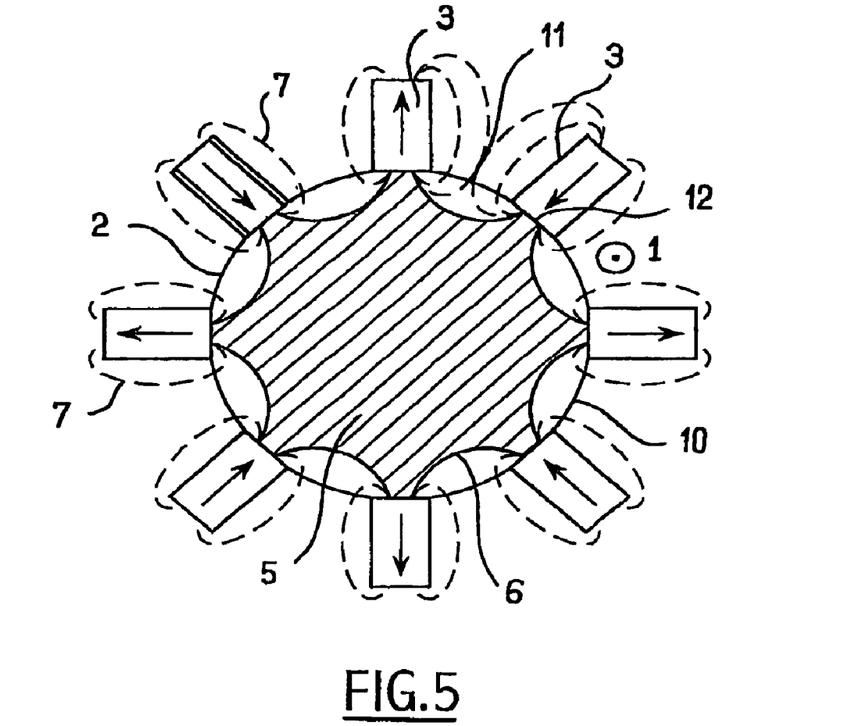
FIG. 5, already commented on, shows a cross section through a chamber according to the state of the art using the structures in FIGS. 2 to 4.

FIG. 5 diagrammatically shows a cross section of an example device divulged in the said publications. It comprises a chamber 10 comprising a wall 2, plasma 5 confined in the chamber 10 by means of permanent magnets 3. In this example, the magnets are located outside the chamber, but it can be seen that at least one pole of each magnet 3 is on the wall 2. Magnetic field lines are shown diagrammatically by arcs of circles 6 and 7. The magnetisation lines 7 loop back on themselves and intercept the wall 2.

The different magnet structures may be used on the device in FIG. 5. For example, the structures in FIGS. 2 to 4 can be used along direction 1 shown in FIG. 5. Direction 1 is then perpendicular to the plane of the figure.

Figure 6:
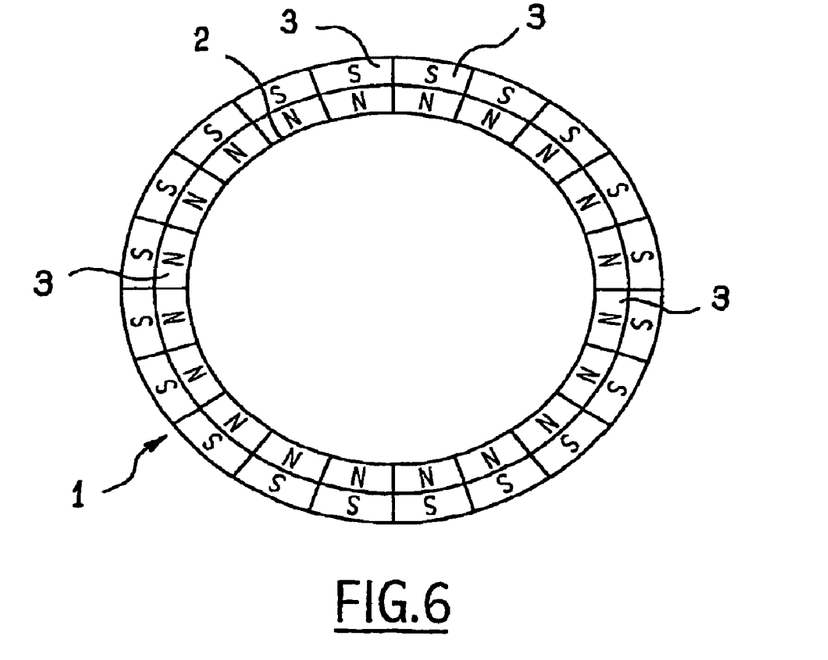
FIG. 6, already commented on, shows a cross section through a confinement device with a multipole structure along a continuous line.

The structures can also be used along another direction, namely direction 1 can be placed along the transverse plane of the chamber as shown in FIG. 6, using the structure in FIG. 2 as an example.

A first embodiment according to FIG. 5 or 6 shows a structure according to FIG. 2. With reference to FIG. 2, it can be seen that no magnetic field line 7 of a permanent magnet loops back along direction 1 on the back face of the same magnet, since the structure is continuous along this direction.

However, festoon losses (mechanism 2), trapping losses (mechanism 3), and wall losses are very high with this structure. They are linear.

Line 11 represents losses of charged particles that strike the pole of a magnet or the wall facing the said pole (maximum magnetic intensity).

Line 12 represents losses of charged particles that strike the wall between two poles with opposite polarity (minimum magnetic intensity).

Lines 11 and 12 can be seen in the cross-section in FIG. 5.

A second embodiment according to FIGS. 5 and 6 uses a structure as shown in FIG. 3.

The field lines 7 that loop back onto the same permanent magnet 3 intercept the wall 2 of the chamber 1. Therefore, there are isolated losses by mechanisms 2 and 3.

Points 11 in FIG. 3 correspond to festoons, and also to paths of particles trapped on field lines 7 by mechanism 3. Consequently, particles oscillating on a field line looping back on the same magnet 3 or arriving at a festoon will be intercepted by the wall 2 of the chamber and are lost for the plasma.

In checkerboard structures, festoons and impact points 12 of particles trapped on lines 6 are isolated and also correspond to geometric centres of the faces of permanent magnets Therefore, losses are relatively low compared with the first embodiment.

In the checkerboard magnetic configuration, only charged particles reflected by mechanism 1 are actually confined by the magnetic field created by the series of permanent magnets.

A third embodiment shown in FIGS. 5 and 6 uses a structure according to FIG. 4.

It shows a case intermediate between the previous two cases, with a confinement efficiency intermediate to the two others.

There is a loopback of field lines on the back of the magnet along direction 1. Therefore, charged particles are intercepted by the wall of the chamber. These interceptions of particles by the wall according to mechanism 3 are represented by crosses 11.

Isolated losses by mechanisms 2 and 3 take place along direction 2.

There are other disadvantages with the structures described above, apart from the plasma losses mentioned above.

There are three main disadvantages.

1/ It is difficult to make and to use "magnetron" type structures closed on themselves, since the said structures avoid plasma losses at the ends of continuous structures.

2/ It is difficult to insert non-linear magnetic structures in a vacuum chamber. Thus, only some chamber geometries are suitable for containing simplified linear magnet structures such as cylindrical or parallelepiped shaped structures.

3/ Continuous magnet lines require large quantities of heavy and expensive permanent magnets.

Presentation of the Invention

The invention proposes to overcome these disadvantages.

The invention proposes a multipole magnetic confinement structures for overcoming these disadvantages, while providing a very high confinement efficiency for charged plasma species.

Therefore, the invention proposes a device for confinement of plasma in a chamber comprising means of creating a magnetic field, the said means comprising a series of permanent magnets capable of creating a magnetic field presenting a multipole alternating magnetic structure to the plasma, characterised in that the magnets are capable of confining the plasma in a large volume, the magnets being discontinuously distributed around the volume, and in that the magnets are arranged inside the chamber, at a distance from the walls of the chamber held in place by support rods, the support rods extending along the axis of magnetisation of the said magnets and being arranged so that they are centred on the poles of the permanent magnets.

The invention is advantageously complemented by the following characteristics, either individually or in any technically possible combination:

the support rods extend perpendicular to the walls of the chamber;
 the series of permanent magnets is in a discontinuous checkerboard type structure;
 the series of permanent magnets is in a discontinuous structure with interrupted line;
 the permanent magnets have a symmetry of revolution;
 the permanent magnets are cylindrical;
 the cross-section of the rods is small compared with the dimensions of the permanent magnets;
 the support rods are tubes, the permanent magnets being located inside the tubes in the end extending into the chamber, each magnet comprising a plate or a disk made of a material with high magnetic permeability on its face furthest back from the inside of the chamber;
 the material is soft iron;
 it comprises means of cooling the permanent magnets;
 the cooling means comprise a supply-return circulation circuit for a fluid around each magnet, this circuit comprising a duct passing through the centre of the magnet;
 the permanent magnets are contained in an external protective enclosure that contains a non-magnetic conducting or dielectric material;
 it comprises means of producing plasma that are independent of the confinement means;
 the plasma production source is a structure with excitation by thermo-emissive filaments;
 the plasma production source is a structure excited by application of an electric voltage with a given frequency and shape, to the gas;
 plasma production means contain means capable of applying a microwave electric field to the gas;
 it comprises plasma production means that use at least a part of the confinement means;
 the plasma production means are capable of applying an electric voltage with a determined frequency and shape to the confinement structure;
 the plasma production means include means capable of applying an electric microwave field to the gas.

PRESENTATION OF THE FIGURES

Other characteristics, purposes and advantages of the invention will become clearer from the following description that is purely illustrative and is non-limitative, and that should be read with reference to the appended drawings, wherein.

DESCRIPTION OF THE INVENTION

Figure 7:
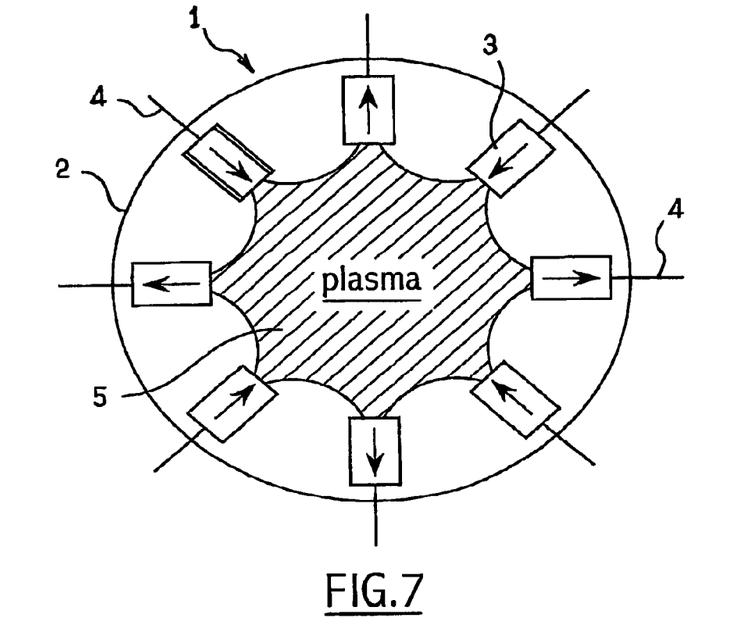
FIG. 7 diagrammatically shows a cross section through a general structure of a confinement device 1 according to the invention.
Figure 8:
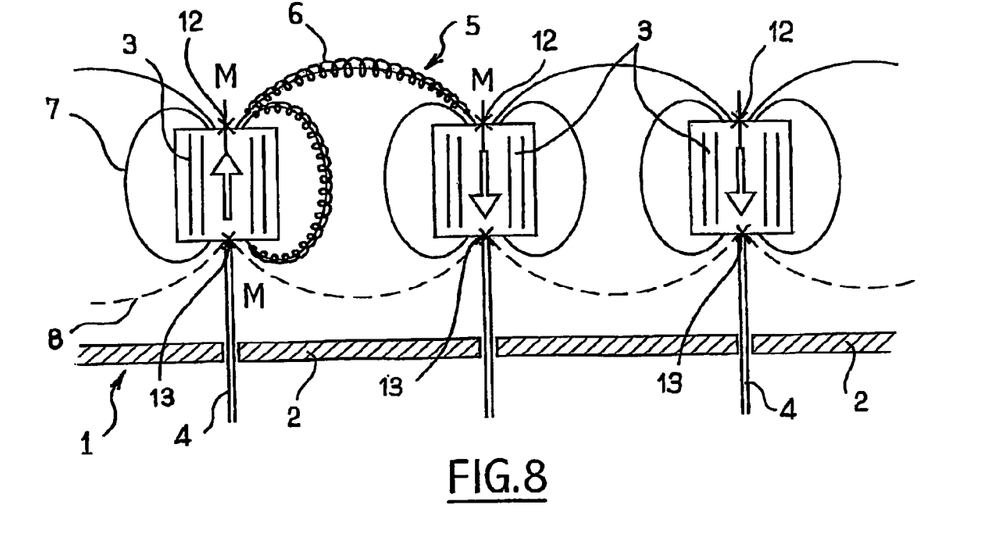
FIG. 8 shows a detailed view of three permanent magnets 3.

Refer to FIGS. 7 and 8 that illustrate a possible embodiment of the invention.

FIG. 7 shows a cross section through the general structure of the confinement device. The device comprises a chamber 1 comprising a wall 2 and several permanent magnets 3 arranged in the said chamber 1. Plasma 5 fills the inside of the chamber 1 and is confined in the said chamber.

FIG. 8 shows details of three permanent magnets 3.

The plasma 5 may be produced by any plasma source (not shown) located around the periphery of or inside the chamber, and operating within a pressure range of less than a few $10^{-2}$ torr.

Firstly, the plasma 5 may be produced by means independent from the confinement means.

For example, the plasma 5 could be produced by excitation by filament. In this case, electrons are emitted by thermo-emissive filaments internal to the confinement structure and negatively polarised with respect to the chamber and the magnetic structure.

Devices can also be used enabling application of an electric voltage to the gas, to generate the low pressure plasma. The electric voltage may have a variety of shapes and frequencies depending on the application. For example, the electric voltage may be DC, pulsed DC, low frequency or radio frequency.

The plasma may also be excited by application of a microwave electrical field to the gas. The microwave field may be accompanied by a magnetic field, and for example it may be an excitation by electronic cyclotron resonance (ECR). The microwave field may also not be accompanied by a magnetic field, and a surface wave excitation can then be used.

The plasma can also be excited by magnetron excitation.

It is also possible to use all or some magnetic confinement structures to excite the plasma, either by application of a DC voltage or a pulsed DC voltage, or a low frequency voltage or a radio frequency voltage, to the structure; or by application of microwaves, for magnetic field excitation (for example ECR) or by surface wave.

Thus in all cases, any plasma excitation type is possible regardless of the excitation frequency and the excitation mode (for example ECR, continuous discharge, pulsed continuous discharge, low frequency discharge, radio frequency discharge, surface wave, inductive discharge or magnetron discharge or ECR).

The plasma reactor described in this application includes required plasma pressure measurement and diagnostic means (not shown in the figures).

Similarly, chamber 1 is equipped with a large number of gas inlet and pumping devices not shown but known in themselves, to maintain the gas pressure to be ionised at a required value and that may for example be equal to $10^{-6}$ torr or less, up to $10^{-2}$ torr, for example, depending on the nature of the gas and the excitation frequency.

The magnets 3 are fixed to the chamber 1 by support rods or tubes 4 centred on the pole of each magnet and along the line of the magnetisation axis of each magnet.

According to one possible embodiment of the invention, the diameter of the supports 4 are very small compared with the dimensions of the magnets 3, and extend perpendicular to the walls 2 of the chamber 1, the said walls 2 extending towards the inside of the chamber 1.

Figure 10:
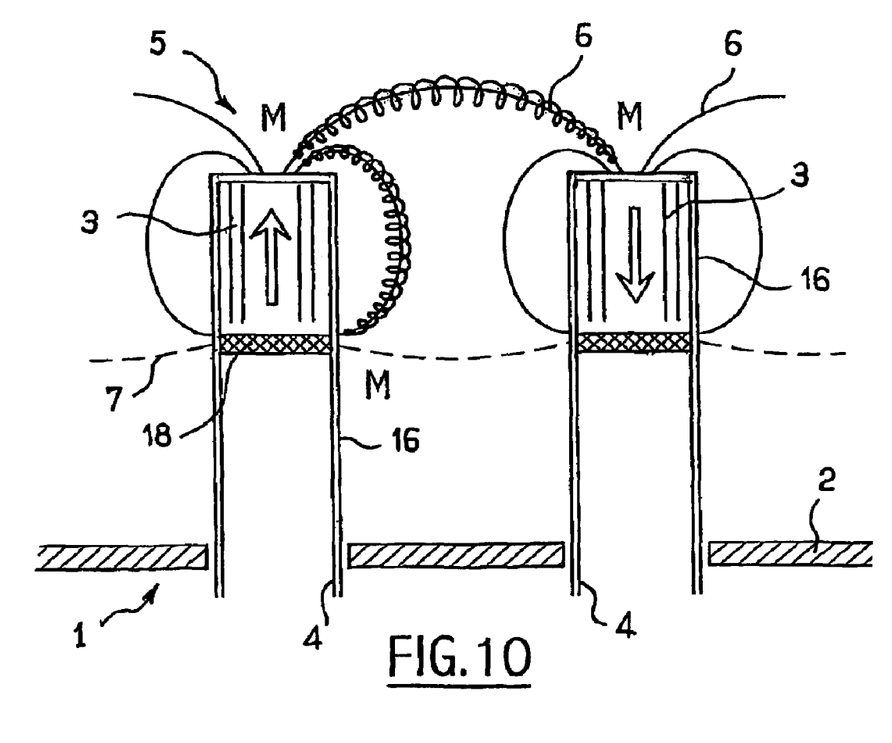
FIG. 10 is a cross sectional view of a variant of the invention including materials with high magnetic permeability in which the permanent magnets are inside support tubes.

According to another embodiment of the invention, for example shown in FIG. 10, the supports 4 may have approximately the same diameter as the magnets. Plates or disks 18 with a high magnetic permeability are then provided.

Similarly, according to another embodiment not shown in the figures, the supports do not need to be perpendicular to the walls 2 of the chamber 1, but may be arranged skew to the walls.

Preferably, the permanent magnets 3 have magnetisation axes oriented alternately in one device and then the next. The result is then a multipole structure with fast, almost exponential decay of the intensity of the magnetic field as a function of the distance from the magnets.

FIG. 8 shows the magnetic field lines created by the permanent magnets 3, as solid lines 6, 7 and dashed lines 8.

It can then be seen that the permanent magnets are fixed at a distance from the walls 2 of the chamber 1 such that the walls 2 are outside the effective influence area of the magnets enabling charged particles output from the plasma 5 and trapped in the magnetic field on the lines 7, to oscillate freely within the interval between two elastic or inelastic collisions between particles, without obstacle between two mirror points M with the same magnetic field intensity.

Furthermore, field lines 8 located between the wall 2 and the permanent magnets 3 have a very low probability of trapping charged particles output from the plasma. Charged particles are reflected by field lines 6 located on the side of the plasma 5.

Therefore, there is a very small probability that a charged particle trapped in a field line will meet a wall. Therefore plasma losses by collision with the chamber walls are minimised.

FIG. 8 shows that the festoons 12 of such a device on the faces facing the plasma 5 are identical to the isolated festoons of a discontinuous checkerboard structure (FIG. 3) or an interrupted line structure (FIG. 4). Therefore, festoon losses are less than in a continuous structure (FIG. 2).

According to a first possible embodiment, the sections of the supports 4 are very small (for example small diameter). Consequently, intersections with magnetic field lines 7 are minimised. The result is thus ideally an intersection dimension 13 between oscillating particles and lines 7 approximately equivalent to a dimension of an isolated festoon 12.

According to one embodiment shown in FIGS. 7 and 8, each magnet is composed of a cylindrically shaped magnet with axial magnetisation that is located approximately along the extension of the axis of the support 4.

The fact that the magnets have a symmetry of revolution about the magnetisation axis enables the magnet to represent a perfect "magnetron" type structure all by itself. In this way, particles trapped on the high intensity field lines 7, in other words looping back onto the pole opposite the same magnet, can be diverted around the axis of the magnet without obstacle.

The preferred cylindrical shape has the advantage that it is easier to make than a spherical shaped magnet, but especially it is easier to encapsulate in a sealed enclosure.

Encapsulation in a sealed enclosure is often necessary firstly to prevent plasma contaminations and/or corrosion of magnets by the plasma, and secondly to cool the magnet if necessary.

Obviously, magnet encapsulation and attachment materials are made from non-magnetic materials. For example, non-magnetic metals could be used.

Figure 9:
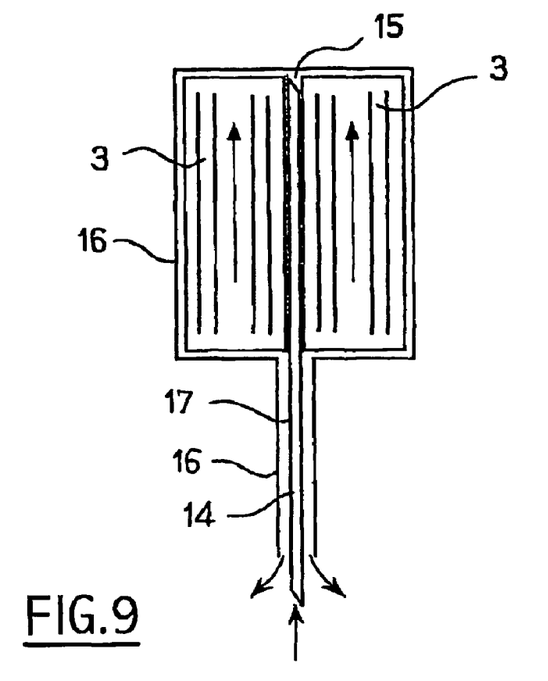
FIG. 9 diagrammatically shows a longitudinal section through the structure of the permanent magnet cooling means.

If it is necessary to cool the permanent magnets (which is the case particularly for applications with dense plasmas), this can be done by fluid circulation in two directions by the use of a tube 4 for attachment of each magnet 3.

An example of such encapsulation is shown in FIG. 9. According to this preferred embodiment, each support 4 may be used to assemble an inlet duct 14 carrying a cooling fluid. It extends along a central bore formed in the magnet 3 along the magnetisation axis of the magnet. This duct 14 made in the form of a tube communicates at its end with a chamber 15 delimited between the magnet 3 and an enclosure 16 surrounding the magnet at a distance from it.

The chamber 15 opens up into a cooling fluid return duct 17 delimited between the inlet duct 14 and the support 4.

The magnet 3 is thus encapsulated by the protective enclosure 16 enabling circulation of a cooling fluid around the magnet 3. For example, the magnet encapsulation material and the material forming the supports 4 are made from a good conducting non-magnetic material (non-magnetic metals) but they can also be surrounded by dielectric materials for contamination reasons, without preventing the device from operating correctly.

One variant illustrated in FIG. 10 of the device according to the invention consists of using an attachment and support tube 4 with a constant diameter equal to approximately the diameter of the permanent magnet. This attachment tube 4 fixes and encapsulates the magnets. Each permanent magnet is located in the end of the tube that is extends in the plasma. The permanent magnets are cooled if necessary.

In this variant, trapped particles are able to oscillate freely between points M.

According to this variant, each permanent magnet 3 located in a tube 4 is made from a material with a high magnetic permeability 18 (for example such as a soft iron plate or disk) on its polar face furthest from the plasma. In this configuration, the electrons may also oscillate between two mirror points M. One of the points M is no longer facing the pole of the magnet, but is on the side along the support 4, while the other point M remains facing the pole. Thus, the presence of the plate or the disk 18 on the outermost face from the plasma 5 is used to modify the position of the mirror points M associated with the poles of each permanent magnet 3, in space.

These magnetic structures have very good plasma confinement efficiency, and may be adapted to a very wide variety of chamber geometries, for example cylindrical geometries as shown in FIG. 7.

Advantages

The described devices can give very good plasma confinement efficiency.

Figure 11:
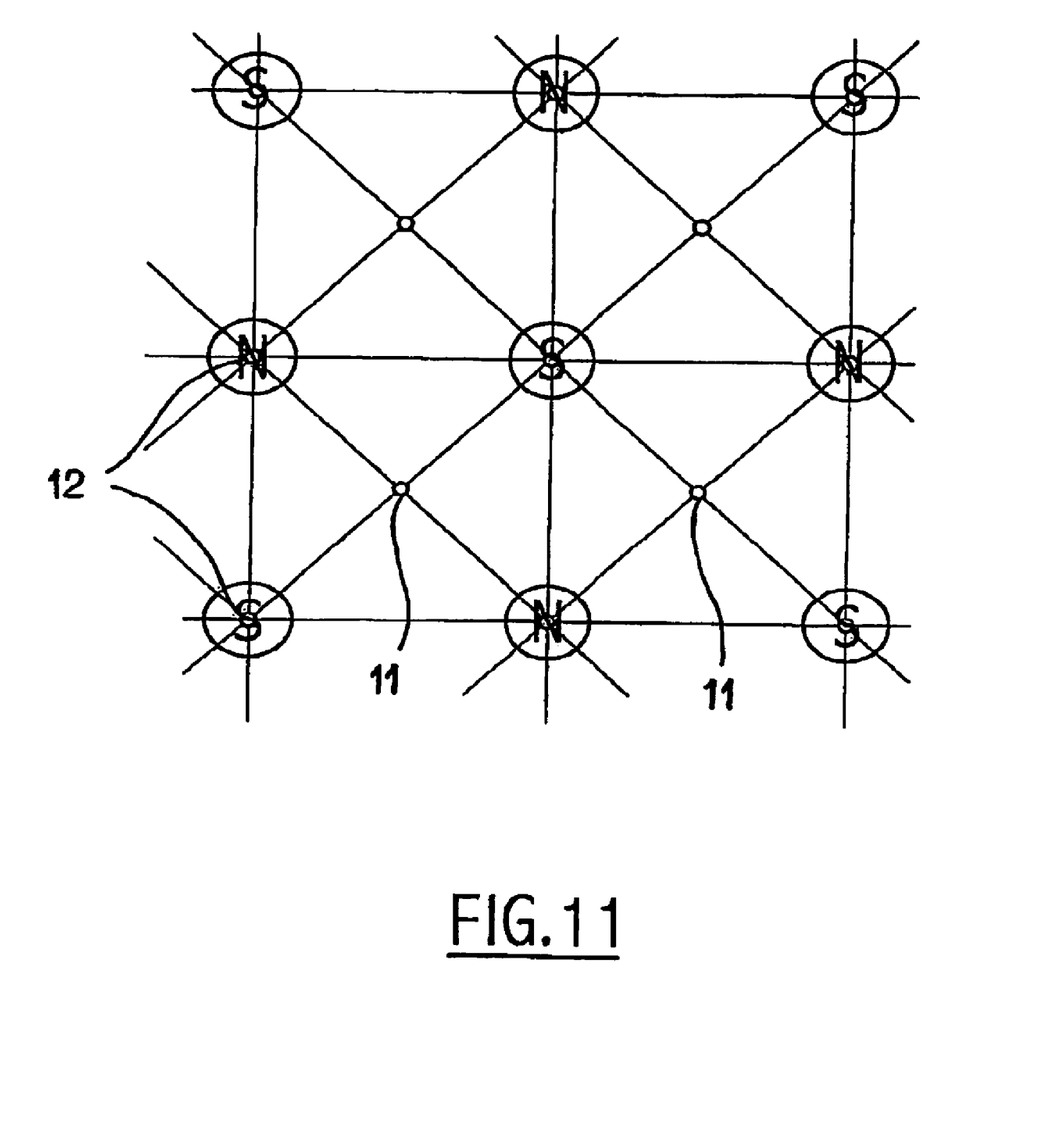
FIG. 11 diagrammatically shows a front view of a checkerboard structure according to the invention, on which isolated festoons are shown.

They minimise losses of charged particles by the different mechanisms. In particular, as shown in FIG. 11, festoon losses are reduced. In the checkerboard structure used in possible embodiments of the invention, field lines 6 form a protective barrier on which particles are reflected or oscillate. Points 11 and 12 on FIG. 11 show isolated festoons. Thus in this type of structure, on average there are only two isolated festoons per permanent magnet, instead of a complete line of festoons on a continuous structure.

Furthermore, each permanent magnet forms a perfect three-dimensional magnetron structure due to its symmetry of revolution, which correspondingly limits losses of charged particles and also makes the plasma perfectly stable.

Moreover, multipole structures proposed by the invention are very easy to use. They only require a very small number of permanent magnets compared with a continuous linear structure, which makes important cost and weight savings for large volume chambers.

Multidipole magnetic structures proposed by the invention use magnets with the same nature (for example made of barium strontium ferrite, samarium-cobalt, neodymium-iron-boron) and with the same dimensions (unit magnets with dimensions of approximately one centimetre, distance between magnets equal to a few centimetres) as in conventional multipole structures.

As non-limitative examples, this type of multidipole confinement structure may be made with samarium-cobalt magnets 2 cm in diameter and 3 cm long, with one every 7 cm around the periphery of a cylindrical chamber.

The device according to the invention is advantageously used in Plasma Based Ion Implantation (PBII), direct or reactive plasma assisted sputtering, microwave plasma assisted Chemical Vapour Deposition (CVD), etching, or even thermochemical treatments.

Note also their application to sputtering of magnetic materials, dielectric deposits with high permittivity, for example such as grid oxides in microelectronics.

The invention claimed is:

1. A device for confinement of plasma in a chamber comprising creation means for creating a magnetic field, said creation means comprising a series of permanent magnets capable of creating a magnetic field presenting an alternating multipole magnetic structure to the plasma, wherein the magnets are capable of confining the plasma in a large volume, the magnets being discontinuously distributed around the volume, and wherein the magnets are arranged inside the chamber, at a distance from walls of the chamber held in place by support rods, the support rods extending along the axis of magnetisation of said magnets and being arranged so that the support rods are centred on poles of the permanent magnets, such that the walls are outside an effective influence area of the magnets.

2. The device according to claim 1, wherein the support rods extend perpendicular to the walls of the chamber.

3. The device according claim 1, wherein the series of permanent magnets is in a discontinuous checkerboard type structure.

4. The device according to claim 1, wherein the series of permanent magnets in a discontinuous structure with interrupted line.

5. The device according to claim 1, wherein the permanent magnets have a symmetry of revolution.

6. The device according to claim 1, wherein the permanent magnets are cylindrical.

7. The device according to claim 1, wherein the cross-section of the rods is small compared with the dimensions of the permanent magnets.

8. The device according to claim 1, wherein the support rods are tubes, the permanent magnets being located inside the tubes in the end extending into the chamber, each magnet comprising a plate or a disk made of a material with high magnetic permeability on its face furthest back from the inside of the chamber.

9. The device according to claim 8, wherein the material is soft iron.

10. The device according to claim 1, comprising cooling means for cooling the permanent magnets.

11. The device according to claim 10, wherein the cooling means comprise a supply-return circulation circuit for a fluid around each magnet, this circuit comprising a duct passing through the centre of the magnet.

12. The device according to claim 1, wherein the permanent magnets are contained in an external protective enclosure that contains a non-magnetic conducting or dielectric material.

13. The device according to claim 1, comprising a plasma production source of producing plasma that is independent of the confinement means.

14. The device according to claim 13, wherein the plasma production source is a structure with thermo-emissive filament excitation.

15. The device according to claim 13, wherein the plasma production source is a structure excited by application of an electric voltage with a given frequency and shape, to the gas, for a required application.

16. The device according to claim 13, wherein plasma production means contain means capable of applying a microwave electric field to the gas.

17. The device according to claim 1, comprising plasma production means that use at least a part of the confinement means.

18. The device according to claim 17, wherein the plasma production means are capable of applying an electric voltage with a determined frequency and shape to the confinement structure, for a required application.

19. The device according to claim 17, wherein the production means include means capable of applying an electric microwave field to the gas.

* * * * *